United States Patent
Suzuki

(10) Patent No.: US 9,384,849 B2
(45) Date of Patent: Jul. 5, 2016

(54) MEMORY CONTROL APPARATUS, MEMORY CONTROL METHOD, AND STORAGE MEDIUM

(71) Applicant: CANON KABUSHIKI KAISHA, Tokyo (JP)

(72) Inventor: Hiroshi Suzuki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/580,148

(22) Filed: Dec. 22, 2014

(65) Prior Publication Data

US 2015/0187430 A1   Jul. 2, 2015

(30) Foreign Application Priority Data

Dec. 26, 2013   (JP) ................. 2013-269660

(51) Int. Cl.
*G06F 17/30*   (2006.01)
*G11C 16/34*   (2006.01)
*G11C 16/10*   (2006.01)
*G11C 16/26*   (2006.01)

(52) U.S. Cl.
CPC ............ *G11C 16/3495* (2013.01); *G11C 16/10* (2013.01); *G11C 16/107* (2013.01); *G11C 16/26* (2013.01); *G11C 2211/5646* (2013.01)

(58) Field of Classification Search
CPC ............................ G06F 12/0646; G06F 3/064
USPC ......................................... 711/161, 165, 202
See application file for complete search history.

(56) References Cited

U.S. PATENT DOCUMENTS

2010/0064111 A1* 3/2010 Kunimatsu .............. G06F 12/08
                                                              711/161

FOREIGN PATENT DOCUMENTS

JP             4037605 B2    1/2008

* cited by examiner

*Primary Examiner* — Lam Nguyen
(74) *Attorney, Agent, or Firm* — Canon USA, Inc. I.P. Division

(57) ABSTRACT

A memory control apparatus, a memory control method, and a program are provided which allow reduction of the number of times of writing to a nonvolatile memory. According to the present invention, both of data to be written to one block of a plurality of blocks dividing a storage region of a nonvolatile memory and information for identifying the number of times of writing to the nonvolatile memory are written to the one block.

20 Claims, 12 Drawing Sheets

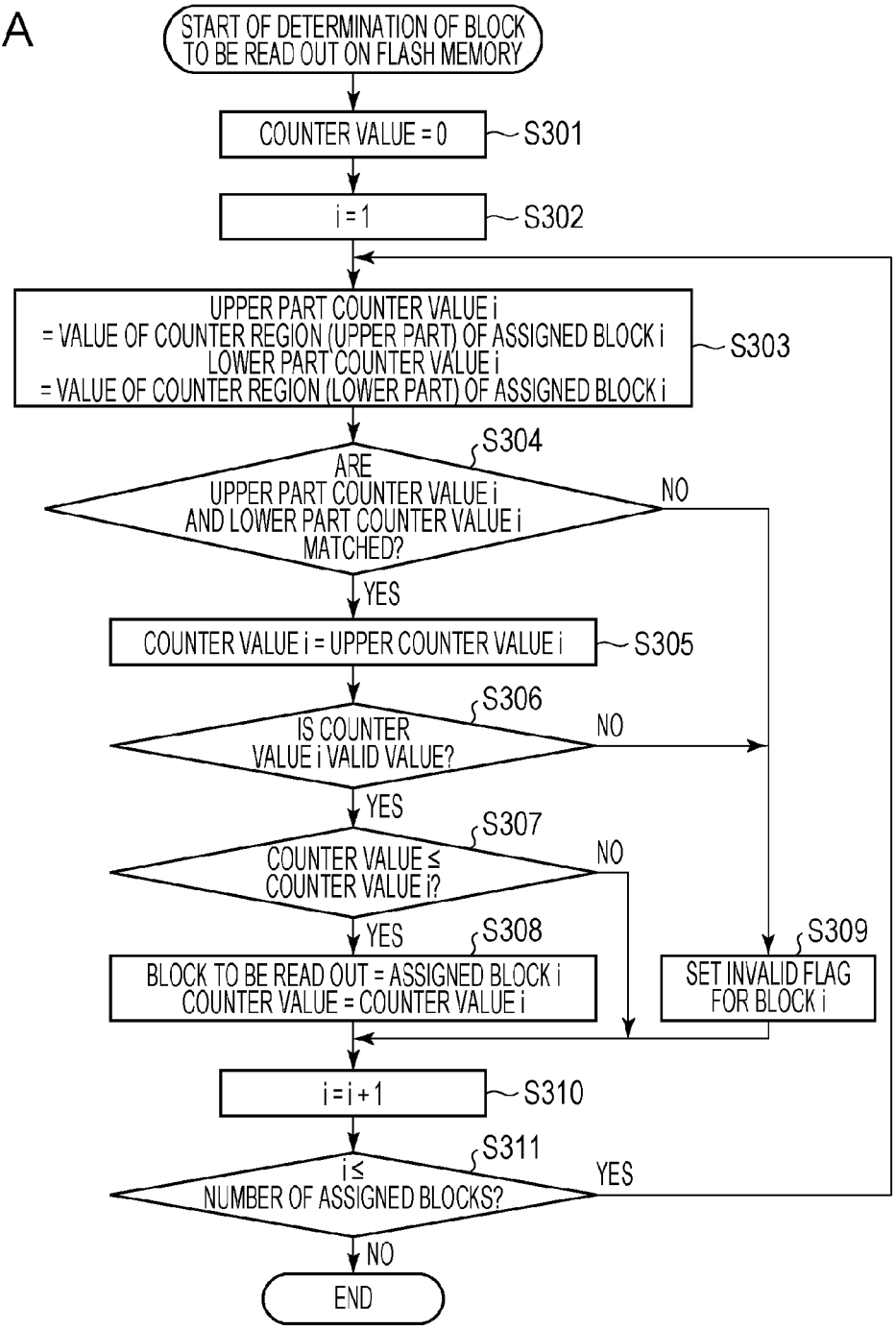

COUNTER REGION (UPPER PART)
STORAGE INFORMATION REGION
COUNTER REGION (LOWER PART)

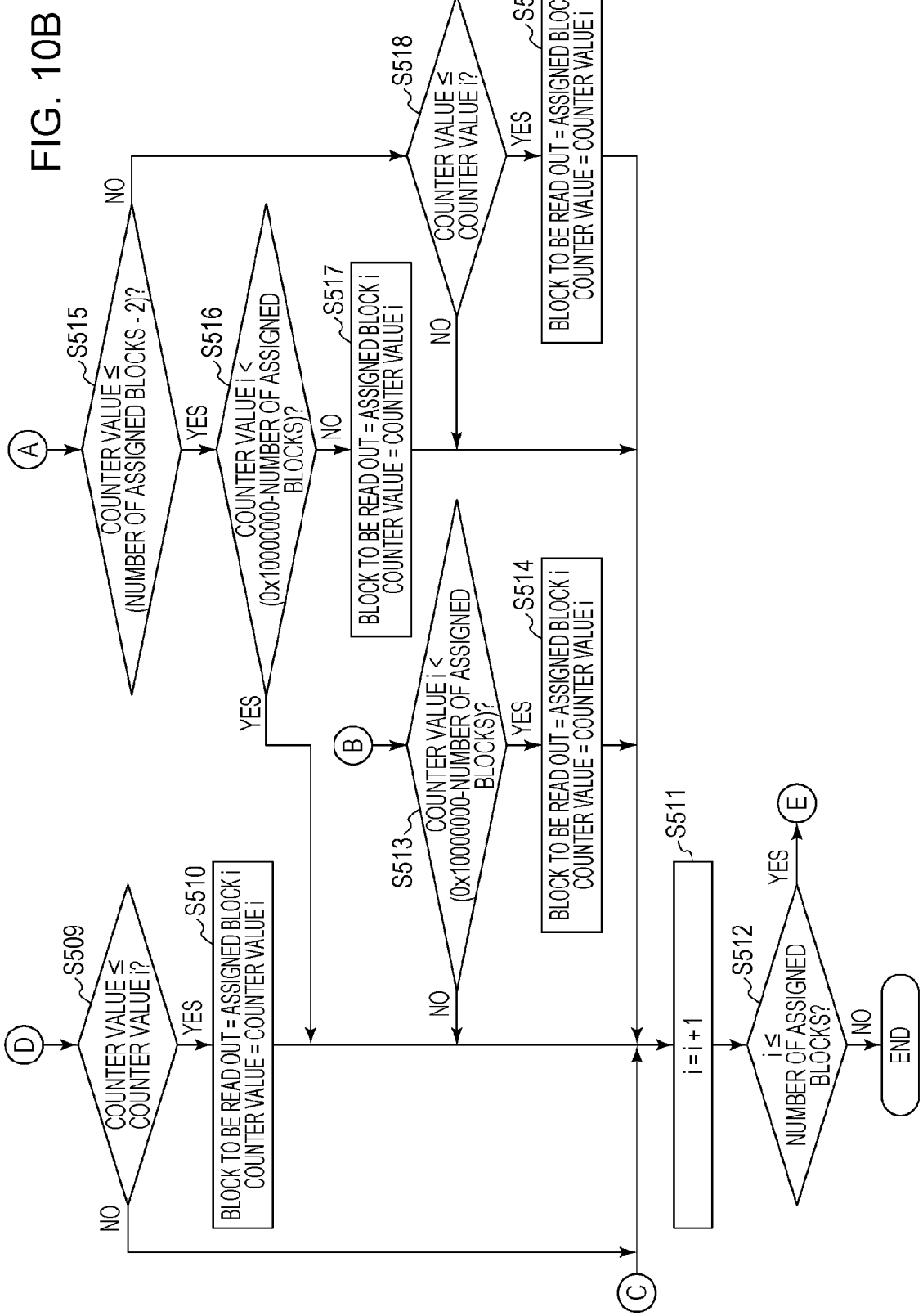

FIG. 11A

| 0x00000000 | BLOCK 1 |
| 0xFFFFFFFD | BLOCK 2 |
| 0xFFFFFFFE | BLOCK 3 |

FIG. 11B

| 0x00000000 | BLOCK 1 |
| 0x00000001 | BLOCK 2 |
| 0xFFFFFFFE | BLOCK 3 |

MEMORY CONTROL APPARATUS, MEMORY CONTROL METHOD, AND STORAGE MEDIUM

BACKGROUND OF THE INVENTION

1. Field of the Invention

The present invention relates to a memory control apparatus, a memory control method, and a storage medium for writing data to a nonvolatile memory.

2. Description of the Related Art

In the past, some apparatuses may include an EEPROM and a flash memory as a nonvolatile memory within the apparatus. In a case where power is shut down during a process for writing data to such a nonvolatile memory, data which has not been properly and completely written may be read out when power is supplied again. Such a nonvolatile memory may sometimes have a set limited number of times of rewriting. A technology is provided which may store in the nonvolatile memory information for controlling data writing and data reading to and from the nonvolatile memory.

Japanese Patent No. 4037605 discloses that a plurality of blocks are assigned as memory regions in a nonvolatile memory and target data are to be written in the plurality of blocks. When data are written to the blocks, a history of writing operations is written as flag data in another block in the nonvolatile memory. It is further disclosed that a block to which data are to be written and a block from which data are to be read are selected with reference to the flag data.

The disclosed technology writes flag data describing a history of writing operations in a block which is different from a block subject to the writing operations.

Accordingly, writing predetermined data to a nonvolatile memory may require a block to which the predetermined data are to be written and another block to which the flag data are to be written. Therefore, at least two blocks may be required to write the predetermined data and the flag data for a data writing operation.

SUMMARY OF THE INVENTION

The present invention provides a memory control apparatus, a memory control method, and a storage medium which allow reduction of the number of times of writing to a nonvolatile memory.

Further features of the present invention will become apparent from the following description of exemplary embodiments with reference to the attached drawings.

BRIEF DESCRIPTION OF THE DRAWINGS

FIGS. 7A and 7B are diagrams for explaining processing for determining a target block from which data are to be read out.

FIGS. 10A and 10B are flowcharts illustrating an example of processing for determining a block to be read in a case where the processing illustrated in FIG. 9 sets a counter value.

FIGS. 11A and 11B illustrate examples of counter values corresponding to blocks in a case where the processing illustrated in FIG. 9 sets counter values.

DESCRIPTION OF THE EMBODIMENTS

An embodiment will be described below. It should be noted that the following embodiment will be given for exemplary illustration purpose only, and the present invention is not limited by the following embodiment.

(1) System Configuration

Figure 1:
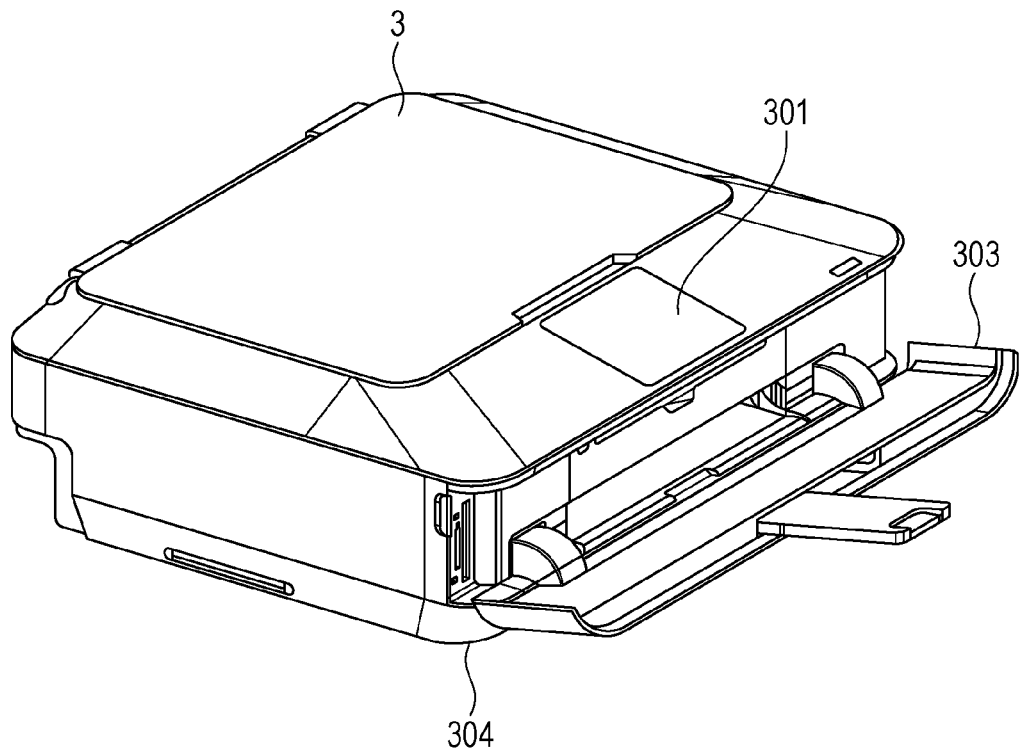
FIG. 1 illustrates an ink jet printer that is an example of a memory control apparatus according to an embodiment.

First, a configuration of a system will be described which controls a nonvolatile memory according to this embodiment. FIG. 1 illustrates an ink jet printer 3 which is an example of a memory control apparatus according to an embodiment. It should be noted that the memory control apparatus is not limited to an ink jet printer but may be a printing apparatus supporting an electrophotography which uses toner as a recording material for printing, a multi-function peripheral including a scanner for reading a document in addition to a printer, or the like. Without limiting to a printer, the memory control apparatus may be a PC (personal computer), a smart phone, a tablet, a cellular phone, a digital camera or other apparatuses.

An operation UI unit 301 is a user interface configured to present displays to a user and to be operated by a user for inputting an instruction. The operation UI unit 301 may present displays such as an image to be printed and a function and a state of the ink jet printer 3. A touch panel serving as an operating device to be operated by a user is provided on a display screen. However, an operating device such as a button may be provided.

A sheet loading unit 304 is configured to load a sheet on which an image is to be printed. A discharge tray 303 is configured to hold a sheet after printing.

The ink jet printer 3 internally contains a print engine unit 302 including a conveyance mechanism configured to pick up a sheet from the sheet loading unit 304 and conveying the sheet and a mount unit which mounts a recording head. When a printing operation is instructed from the operation UI unit 301 or an external device, for example, ink is ejected from a recording head mounted in the print engine unit 302 to a sheet conveyed by the conveyance mechanism in the print engine unit 302. Thus, an image is printed on the sheet, and the sheet is discharged to the discharge tray 303.

The print engine unit 302 further includes a capping mechanism configured to cap the recording head. For prevention of clogging of a discharge port due to hardened ink at the ink discharge port in a recording head, the print engine unit 302 caps the recording head by using the capping mechanism in a standby state where printing is not being executed. A printing operation is performed by cancelling the capping.

The print engine unit 302 further performs a recovery operation for maintaining a print quality in accordance with the cap open/closed state of the capping mechanism before printing when power is supplied to the ink jet printer 3. In other words, if the cap is open when power is supplied, a recovery operation is performed which discharges ink from the recording head because there is a possibility that a surface of the recording head is dried unsuitably for printing.

Figure 2:
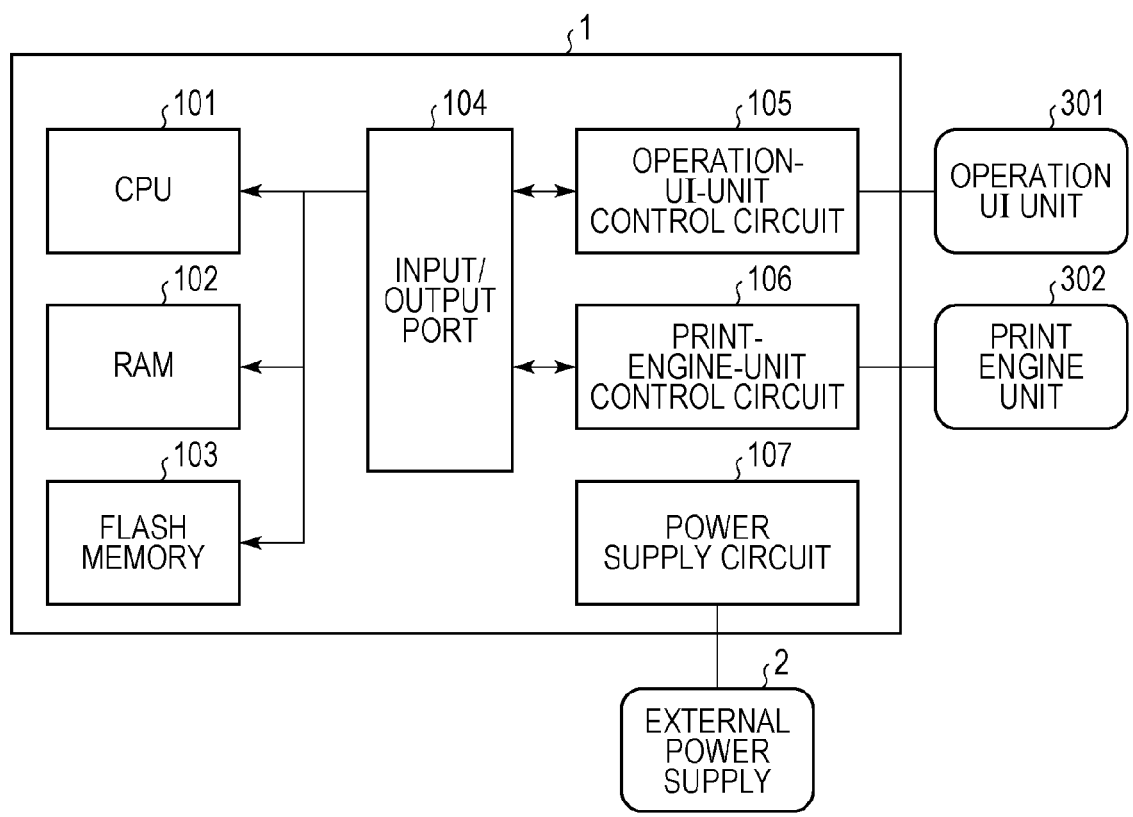
FIG. 2 is a diagram for explaining an electronic control circuit board installed within the ink jet printer for controlling the ink jet printer 3.

FIG. 2 is a diagram for explaining an electronic control circuit board 1 installed within the ink jet printer 3 for controlling the ink jet printer 3.

A CPU 101 is a control unit configured to generally control the electronic control circuit board 1 and the ink jet printer 3. A flash memory 103 is a nonvolatile memory configured to store a control program for controlling a component of the ink jet printer and control information regarding a setting. A RAM 102 is a volatile memory configured to temporarily hold a control program and control information.

The CPU 101 reads out the control program and control information stored in the flash memory 103 to the RAM 102 and executes the control program in accordance with the control information to generally control the ink jet printer 3.

An input/output port 104 is a port configured for connection between the CPU 101, and an operation-UI-unit control circuit 105 and a print-engine-unit control circuit 106, which will be described below.

The operation-UI-unit control circuit 105 is configured to cause the operation UI unit 301 to display an image and information under control of the CPU 101 through the input/output port 104. The operation-UI-unit control circuit 105 is further configured to input a user instruction in accordance with a user operation performed on the operation UI unit 301. The CPU 101 is configured to perform control in accordance with a user instruction input through the input/output port.

The print-engine-unit control circuit 106 is configured to output an image to be printed to the print engine unit 302 and causes the print engine unit 302 to print the image on a print medium under the control of the CPU 101.

A power supply circuit 107 is capable of connecting to an external power supply 2 such as an AC power supply via a power supply cable. When the power supply circuit 107 is connected to the external power supply 2, power is supplied from the external power supply 2 to the power supply circuit 107, and the power is supplied to the whole electronic control circuit board 1. When a user presses a power button, not illustrated, in a state that power supply to the electronic control circuit board 1 is allowed, the ink jet printer 3 may be activated.

According to this embodiment, when power is supplied from the power supply circuit 107 to the electronic control circuit board 1, a control program and control information stored in the flash memory 103 are stored to the RAM 102. When a user presses the power button, not illustrated, in a state that the ink jet printer 3 is active, the ink jet printer may be powered off. At that time, the control information stored in the RAM 102 is stored to the flash memory 103. Thus, when the power supply cable is removed from the external power supply 2 after a user presses the power button to power off the ink jet printer 3, data written to the RAM 102 in the activated state may be written to the flash memory 103 that is a nonvolatile memory.

The ink jet printer 3 may be capable of reading a document by using a reading engine, not illustrated, and transmitting/receiving data through facsimile communication or over a network such as a LAN and the Internet.

(2) Data Stored in the Flash Memory 103

Figure 3:
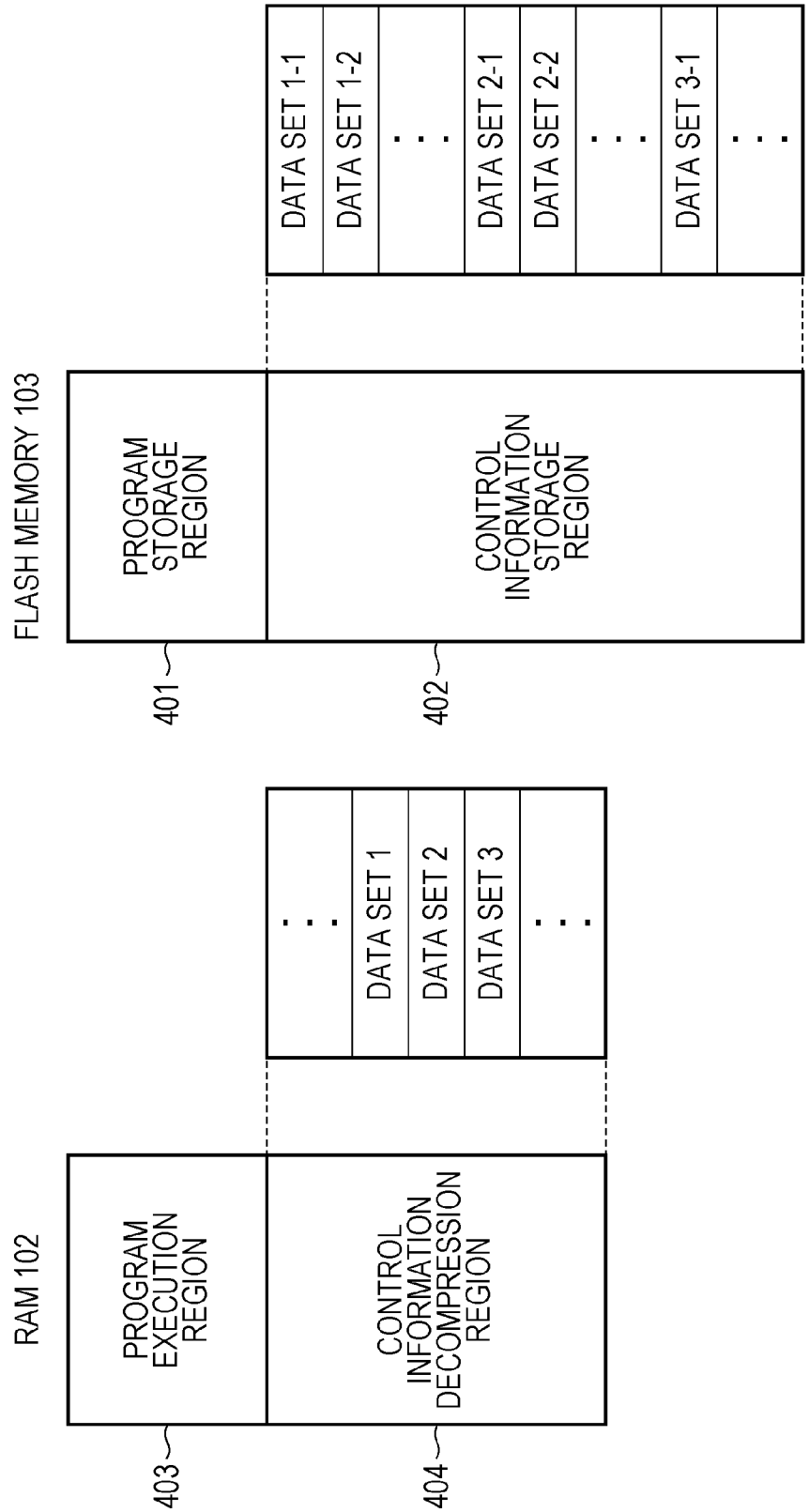
FIG. 3 is a schematic view of an internal data mapping between a RAM and a flash memory.

Next, data to be written from the RAM 102 to the flash memory 103 and read from the flash memory 103 to the RAM 102 will be described. FIG. 3 is a schematic view of internal data mapping between the RAM 102 and the flash memory 103.

The flash memory 103 includes a program storage region 401 usable for storing a control program and a control information storage region 402 usable for storing control information. Similarly, the RAM 102 includes a program execution region 403 usable for decompressing a control program read out from the flash memory 103 and usable as a work memory for program execution. The RAM 102 includes a control information decompression region 404 usable for decompressing control information and history information from the flash memory 103.

The control information storage region 402 in the flash memory 103 may store control variables for executing a process by the CPU 101 in accordance with a control program and history information describing a history of control over the ink jet printer 3.

The control variables may include information on a print quality and a density in printing which are settable by a user, the number of times of printing and a consumption of ink in the ink jet printer 3, for example. The control information storage region 402 may store, as the control information, information describing whether the capping has been executed, information describing whether a sheet exists on a sheet conveyance path for double side printing or not or information describing whether the recording head is being replaced or not.

These control variables and history information may collectively be stored as one data set. The control variables and history information as described above are stored in the control information storage region 402 in association with types of information for distinction as "data set 1, data set 2, data set 3 . . . " in FIG. 3.

For example, a data set 1 contains information for printing including settable control variables such as the number of prints, a print quality, and printing density and history information such as the number of times of printing and a consumption of ink. When the ink jet printer 3 is capable of executing facsimile communication, a data set 2 contains, as information for facsimile communication, control variables such as a FAX number of the ink jet printer 3 and a telephone directory and history information set by a user in the past, for example. When the ink jet printer 3 is capable of executing network communication, a data set 3 may contain control variables such as an IP address of the ink jet printer 3 and setting information for connection to a LAN and history information such as an access destination of a network communication.

A data structure of each of the data sets will be described with reference to FIG. 4.

The control information storage region 402 which is a storage region for control information in the flash memory 103 is divided into a plurality of blocks, and each of the blocks of the memory region is assigned as a memory region for storing each data set. According to this embodiment, one block is a 4K-byte region. The data sets are stored in corresponding blocks separately from each other. Because of the limited data space of each block, control variables and history information are classified based on the types of information, such as data sets 1, 2, 3 . . . , and each data set is stored in each corresponding block.

The control information storage region 402 includes a plurality of blocks each assigned to one of the data sets (1, 2, 3 . . . ). For example, when a data set 1-1 in FIG. 3 has already been written and a data set 1-2 is to be newly written, the data set 1-2 is not written over the data set 1-1 but is written in a different block. Thus, for example, when writing the data set 1-2 fails due to power shutdown during the operation for writing the data set 1-2, the data set 1-1 may be referred to read out information written in the past when power is supplied again.

The writing operation will be described more specifically. For example, when the data set 1 decompressed in the RAM 102 is to be written to the flash memory 103, each of the blocks are referred to determine whether the blocks already contain data or not and a block to which data has been written earlier. If a block which does not contain data is available, the data are written to the block. If no block which does not contain data is available, the data is written to a block to which data has been written earlier. This determination is based on a counter, which will be described below.

Figure 4:
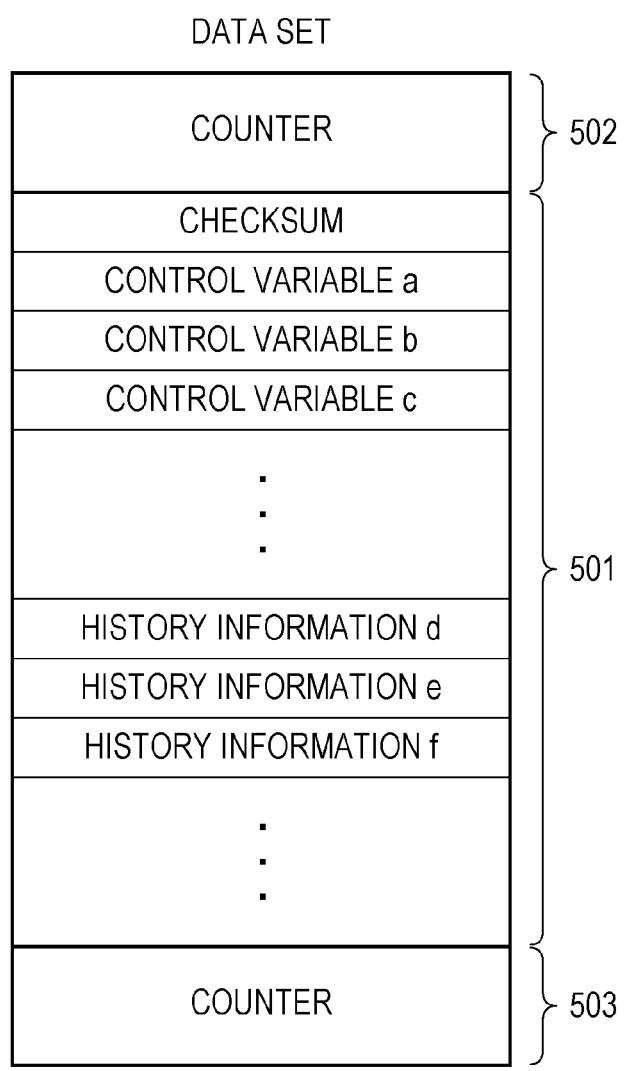
FIG. 4 illustrates a data set of control information.

FIG. 4 illustrates data sets of control information.

One data set includes a control information region 501 for storing control information such as control variables and history information and checksum data and two counter regions 502 and 503 for storing counter values each indicative of the number of data writing operations. The counter region (upper part) 502 is mapped to a part above the control information region 501, and a writing operation is performed before the control information region 501. The counter region (lower part) 503 is mapped to a part below the control information region 501, and a writing operation is performed after completion of the writing operation on the control information region 501.

The two counter regions store count information describing the number of times of writing to a block to which the data set is to be written. According to this embodiment, because the upper limit number of times of rewriting the flash memory is one hundred thousand, it is assumed that the counter region has a size equal to or larger than 4 bytes for recording one hundred thousand values or more.

When the data sets illustrated in FIG. 4 correspond to control information for printing, the control information region 501 may store control variables such as a calibration value for each actuator in the print engine unit 302 and settable information such as a print quality and a printing density, for example. The control information region 501 may further store, as history information, the number of times of printing and a consumption of ink in the ink jet printer 3.

According to this embodiment, in order to write a data set stored in the RAM 102 to the flash memory 103 for power shutdown, the number of times of writing on the block to which the data set is to be written are written to the two counter regions as count information.

In order to decompress a data set stored in the flash memory 103 to the RAM 102 for activation, for example, the count information written in the two counter regions may be referred to select the data set to be decompressed in the RAM 102.

According to this embodiment, both of the count information and the control information are stored in one block, as illustrated in FIG. 4. Thus, the count information may be written or read out more quickly than a case where count information and a block for control information are written in different blocks.

As described above, when a block for count information and a block for control information are different, association between the two blocks may be required. According to this embodiment, because count information and control information are written in one block, the count information may be easily managed.

When count information and control information are stored in different blocks from each other, another 4k-byte block may be required for count information. This may result in an increased number of times of writing to a block for writing count information. According to this embodiment, because count information and control information are written in one block, the memory space for writing control information, count information and the number of times of writing to blocks may be reduced.

(3) Writing to Flash Memory 103

A writing operation from the RAM 102 to the flash memory 103 according to this embodiment will be described in detail. First, data to be decompressed in the RAM 102 will be described.

The program execution region 403 in FIG. 3 is a region where a control program stored in the program storage region 401 in the flash memory 103 is decompressed when the ink jet printer 3 is activated, for example. The CPU 101 performs a control by executing a corresponding control program decompressed in that manner.

The control information decompression region 404 in the FIG. 3 is divided into one or more blocks, and a data set having one block unit is assigned to one block. The block unit is assumed as a block unit (4K bytes) of the flash memory 103. Because the RAM 102 has a smaller data space than the data space of the flash memory 103, a part of a data set stored in the flash memory 103 is read out to the RAM 102.

When the ink jet printer 3 is powered on and is activated, a control program and control information are decompressed from the flash memory 103 to the RAM 102. In a state that the ink jet printer 3 is running, changes to control variables and history information occur in various timings. In each of the timings, the CPU 101 updates the corresponding data in the control information decompression region 404 in the RAM 102. In a specific timing such as a time when the apparatus is powered off, a time when a print setting is changed by a user through the operation UI unit 301, or a time when printing completes, the CPU 101 may store control information data in data sets in the RAM 102 to the flash memory 103.

Figure 5:
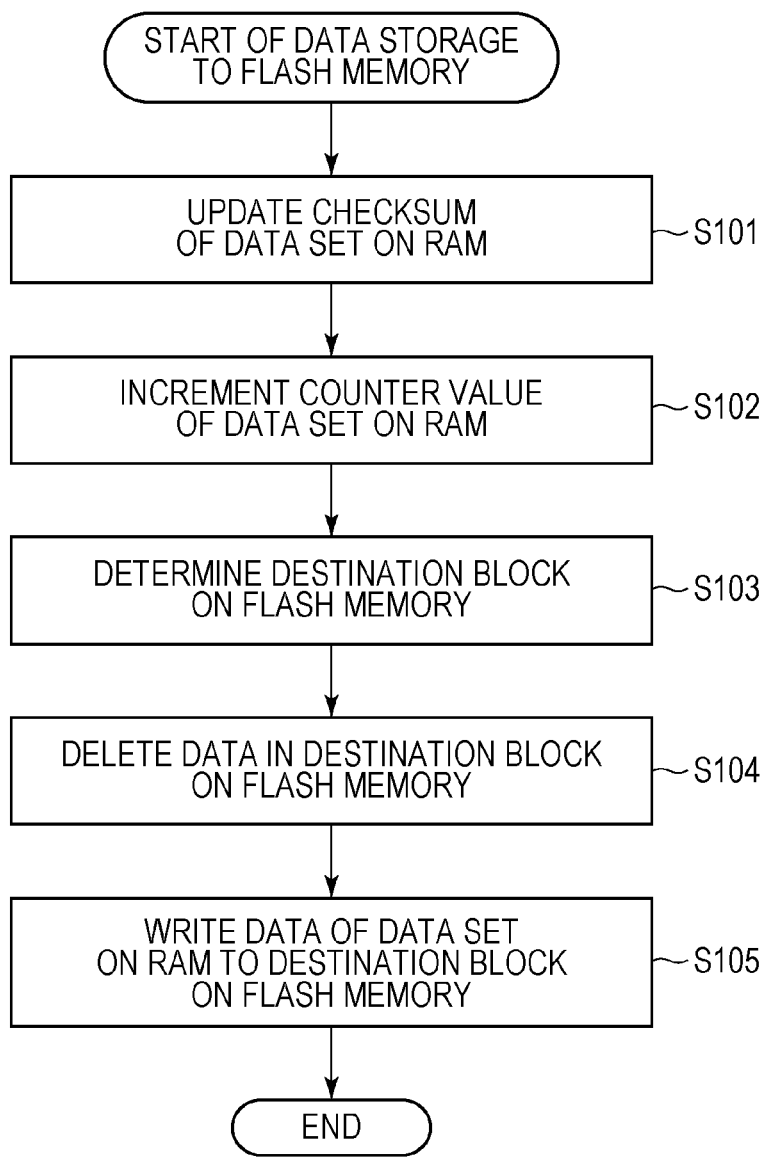
FIG. 5 is a flowchart illustrating processing for storing a data set to the flash memory.

FIG. 5 is a flowchart illustrating processing for storing a data set to the flash memory 103. It should be noted that the CPU 101 executes a control program so that the processing illustrated in the flowchart is implemented.

In S101, the CPU 101 calculates a checksum of a data set decompressed in the RAM 102, updates the value, and writes the it to the RAM 102. Next, in S102, the CPU 101 increments the counter value of the data set and writes it to the two counter regions for the data set on the RAM 102. In this case, an identical value is written to the counter region (upper part) 502 and the counter region (lower part) 503. The counter value is acquired in S102 as information describing the number of times of writing corresponding to writing of the data set and information usable for determination of a block to be read by data readout processing, which will be described below.

Next, in S103, the CPU 101 determines, as a destination block, one of blocks assigned to the data set in the control information storage region 402 in the flash memory 103. When a plurality of blocks are assigned to a type (1, 2, 3 . . . ) of a data set to be written, for example, a block storing an oldest data set of the plurality of blocks is determined as the destination block. More specifically, data are written to a destination block in rotation among blocks in the flash memory 103. Alternatively, count information corresponding to blocks in the flash memory 103 may be referred to determine a block having a lowest count as a destination block.

Next, in S104, the CPU 101 deletes all data in the destination block in the flash memory 103. More specifically, "1" is sequentially written to all bits corresponding to the destination block, which will be described below with reference to FIGS. 8A to 8E.

Next, in S105, the CPU 101 writes data of the data set to the destination block.

As described above, the sequence for storing data to the flash memory 103 performs a deletion process and a writing process to one block on the flash memory 103 for one data set. Because the count information is written within a corresponding one block, no need may arise for writing identification information (such as count information) for identifying a block storing latest data to another block on the flash memory 103. This allows easy association between such identification information and control information and fast writing and reading of control information and identification information.

For example, in synchronism with completion of writing on the flash memory 103 while the ink jet printer 3 is printing, an operation below may sometimes be performed. In such a case, because writing to one block may only be necessary according to this embodiment, a shorter time period may be required for writing than a time required in a case where control information and count information are to be written sequentially to two or more blocks. This may reduce incomplete writing due to sudden power shutdown of the ink jet printer 3, for example.

Such incomplete writing of data to the flash memory 103 will be described with reference to FIGS. 8A to 8E. FIGS. 8A to 8E illustrate states of a block in a case where data writing to the flash memory 103 is not completed appropriately. FIGS. 8A to 8E illustrate patterns of data storage states in one block in the control information storage region 402. In FIGS. 8A to 8E, "xxxxxxxx" represents a counter value before a writing operation, "aaaa . . . aaaa" represents control information data before a writing operation, and "FFFF . . . FFFF" represents a data deleted state. "yyyyyyyy" represents a counter value after a writing operation, and "bbbb . . . bbbb" represents control information data after a writing operation. When a data writing operation is performed on the block, the data storage state of the block sequentially changes from the state in FIG. 8A to the state in FIG. 8E.

Figure 8A:
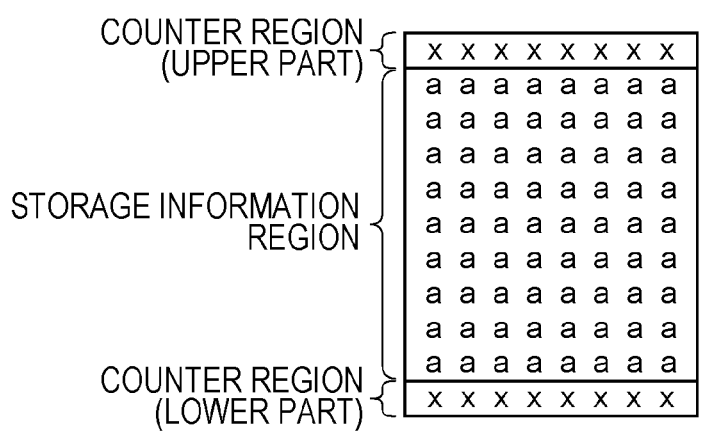
FIGS. 8A to 8E illustrate states of a block in a case where data writing to the flash memory has not properly completed.

FIG. 8A is a state before a data writing operation starts. When a power supply cable is removed from the external power supply 2 or the power fails in that state, for example, the updated data set and incremented count information stored in the RAM 102 are not reflected to the flash memory 103. In other words, when power shutdown occurs before S104 in the flowchart illustrated in FIG. 5, the corresponding block is not changed in the flash memory 103.

Figure 8B:
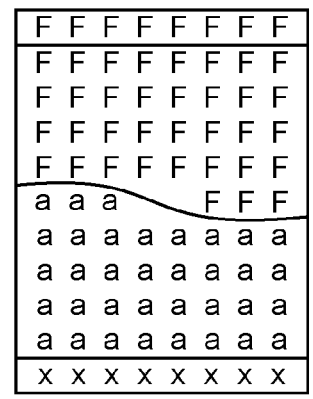

FIG. 8B illustrates a data storage state during the data deletion operation in S104. More specifically, each bit within the block has "1". In the example in FIG. 8B, each bit is represented by 1 byte, and each byte is set to "F". When power is shutdown in the middle of S104, data in the block are partially deleted, resulting in the state illustrated in FIG. 8B in which data before the rewriting operation is left partially.

Figure 8C:
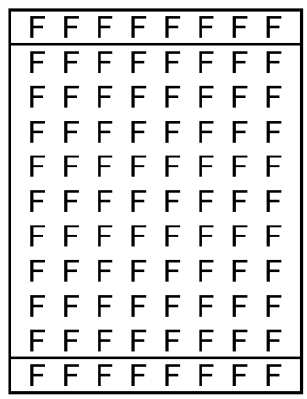

FIG. 8C illustrates a data storage state upon completion of the data deletion process in S104. When power is shut down at that time, data are all deleted in the block (or bits within the block are all "1").

Figure 8D:
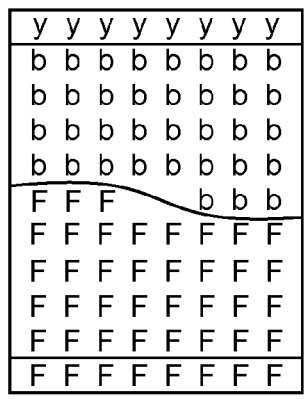

FIG. 8D illustrates a data storage state during a data set writing process in S105. When power is shut down during S105, partial data of a writing target data set are written to the block, and the rest part within the block has a deleted state.

Figure 8E:
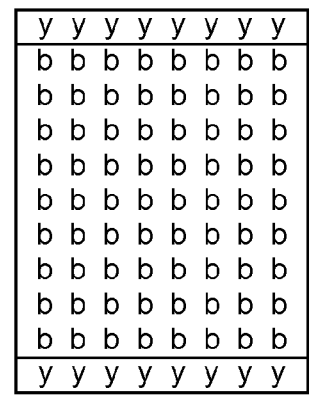

FIG. 8E illustrates a data storage state after the data set writing process in S105 completes. When power is shut down in that state, latest data are appropriately written in the block.

According to this embodiment, at the time when data writing to one block completes as illustrated in FIG. 8E, the data set and count information are written. On the other hand, in a case where count information is to be written to another block, for example, the block must be determined, and the steps as illustrated in FIGS. 8A to 8E must further be performed. In other words, the possibility for power shut down before count information is written may increase.

According to this embodiment, the possibility may be reduced because writing data set to one block includes completion of writing of control information and count information.

(4) Data Readout from Flash Memory 103

Next, how control information data are decompressed from the flash memory 103 to the RAM 102 will be described. When the ink jet printer 3 is powered after the power off state, the control variables and history information stored in the flash memory 103 are decompressed to the RAM 102. As described above, a part of a plurality of data sets stored in the flash memory 103 is read out to the RAM 102. Thus, immediately after the shift from the power-off state to the power-on state, the CPU 101 determines which block stores information of the latest data set among assigned blocks of data sets in the control information storage region 402 of the flash memory 103. The CPU 101 then reads out the data set from the thus determined block.

Figure 6:
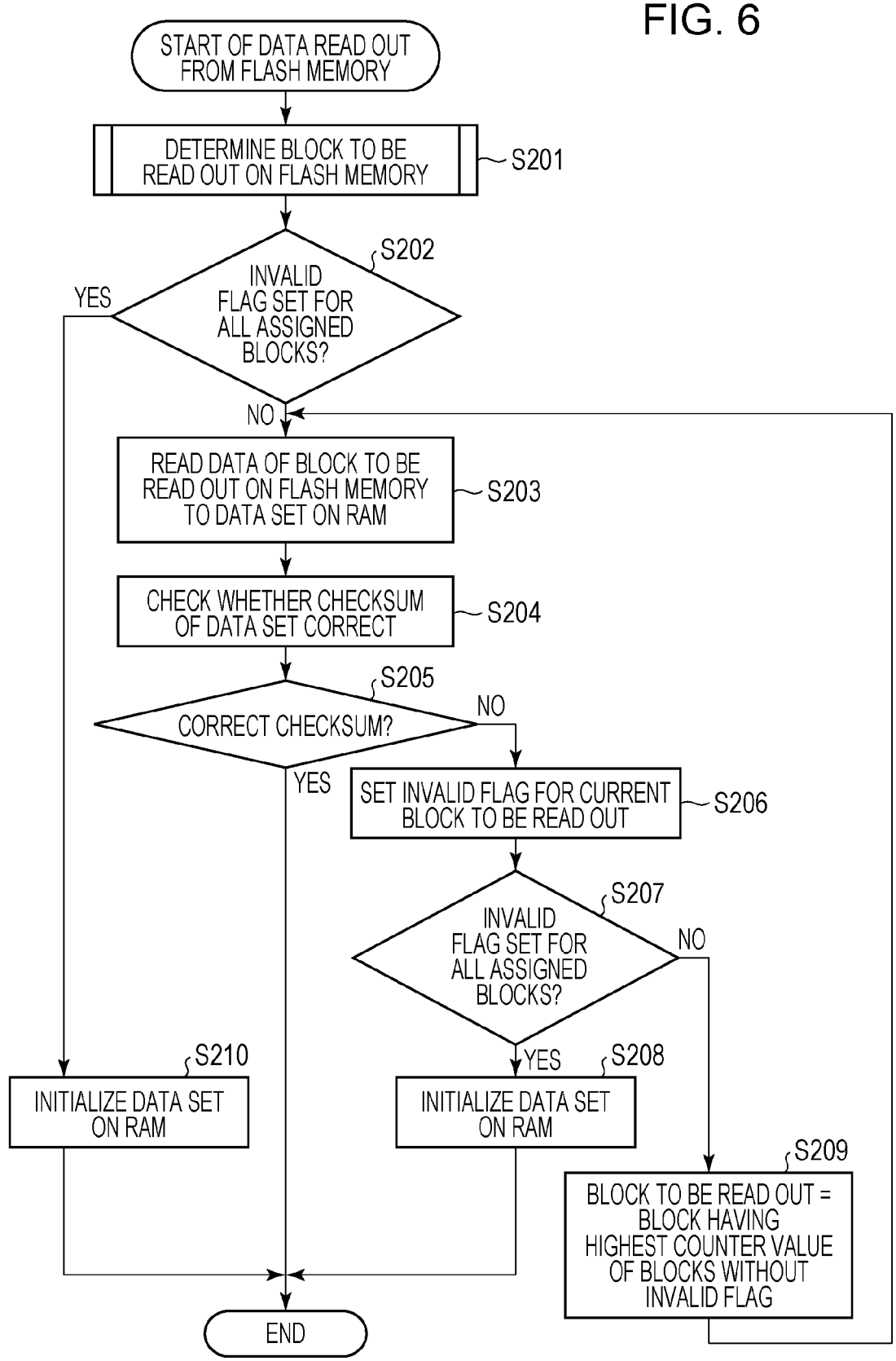
FIG. 6 is a flowchart illustrating processing for reading out data from the flash memory.

FIG. 6 is a flowchart illustrating processing for reading out data from the flash memory 103. The flowchart may be implemented by execution of a control program by the CPU 101.

In S201, the CPU 101 determines a block containing the latest data set as a block to be read based on count information within the blocks in the flash memory 103. Details of the process in S201 will be described with reference to FIGS. 7A and 7B.

FIGS. 7A and 7B are diagrams for explaining the process for determining a block from which data is to be read (hereinafter, sometimes called a data read target block or a read target block). In the process in the flowchart illustrated in FIG. 7A, count information contained in data sets stored in blocks of the flash memory 103 are sequentially read out, and a block from which control information is to be read is determined based on the count information. FIG. 7B illustrates counter value examples corresponding to blocks. Referring to FIG. 7B, three blocks of the flash memory 103 are assigned to data sets of an identical type. Hereinafter such a block will be called an assigned block. In other words, for example, if the data sets are for printing, it is assumed that a maximum of three data sets are written to three blocks in rotation.

In S301 in the flowchart in FIG. 7A, the CPU 101 initializes a variable "counter value" indicative of a counter value of a block which is candidate to be read out (hereinafter, called read candidate block). Next, in S302, variables i indicating block numbers (1, 2, or 3) of blocks from which count information are to be read out.

Next, in S303, the CPU 101 reads out a value of the counter region (upper part) 502 and a value of the counter region (lower part) 503 of the ith assigned block on the flash memory 103 as an upper-part counter value i and a lower-part counter value i, respectively, onto the RAM 102.

Next, in S304, the CPU 101 checks whether the upper-part counter value i and the lower-part counter value i are matched or not. If they are matched, the processing moves to S309 where the CPU 101 sets an invalid flag for the ith assigned block. Then, the processing moves to S310.

The term "invalid flag" refers to a flag by which whether data of a block of interest of the flash memory 103 contain a valid value or an invalid value is identified. An equal number of invalid flags to the number of blocks assigned for data sets in the flash memory 103 are held on the RAM 102. Each of the invalid flags may be used for determining the necessity for reading out from the flash memory 103 in S202 in FIG. 6, which will be described below.

If the upper-part counter value i and the lower-part counter value i are not matched in S304, a case may be possibly occur in which writing has incompletely finished during a deletion process or data writing process performed on the block, as illustrated in FIGS. 8B and 8D. Accordingly, if "No" is determined in S304, the processing moves to S309 so that processing is performed for preventing the block from being read out.

If it is determined in S304 that the upper-part counter value i and the lower-part counter value i are matched, the processing moves to S305 where the CPU 101 sets the upper-part counter value i as the counter value i.

In S306, whether the counter value i is a valid value or not is checked. Here, the term "valid value" refers to a value in a range from 0x0 to 0xFFFFFFFE if the counter region (upper part) 502 and the counter region (lower part) 503 have a 4-byte space. When the counter value i is not included in the range, it is determined as an invalid value.

If it is determined in S306 that the counter value i is invalid, there is a possibility that the counter value i may have been incompletely written and control information in the block may thus have been incompletely written. Because of the possibility, the processing moves to S309 where the invalid flag is set for the block.

If it is determined in S306 that the counter value i is valid, the processing moves to S307 where the counter value of the read-out candidate block and the counter value i are compared.

If the counter value i is equal to or higher than the counter value of the read-out candidate block, the CPU 101 determines that the block i stores newer control information than that in the read-out candidate block, and the processing moves to S308.

In S308, the CPU 101 sets the assigned block i as a read-out candidate block, and the counter value i is set to the counter value of the read-out candidate block. Then, the processing moves to S310.

In S310, the CPU 101 increments the value of i, and i and the number of assigned blocks (3 in this embodiment) are compared in S311. If the value of the number of assigned blocks is equal to or higher than i, it is determined that more read-out candidate blocks remain. The processing returns to S303 and is repeated again. On the other hand, if it is determined in S311 that the value of i is higher than the value of the number of assigned blocks, the processing ends.

By performing the processing illustrated in FIG. 7A (the processing in S201 in FIG. 6), an assigned block having a valid and highest counter value is determined as a read-out target block. It should be noted that, without limiting to a case where identical counter values are input as the upper part and lower part counter values, information corresponding to an upper part and information corresponding to a lower part may be added to a certain counter value, for example. Also in this case, if information excluding the information added to the counter value is matched between the upper part and the lower part, it may be determined that the upper part and the lower part are matched.

After the processing illustrated in FIG. 7A is executed, the CPU 101 moves the processing to S202 in FIG. 6.

In S202, the CPU 101 determines whether invalid flags are set for all assigned blocks in flash memory 103. If invalid flags are set for all assigned blocks, the CPU 101 moves the processing to S210. In S210, the values of the data sets in the control information decompression region 404 in RAM 102 are initialized with a default value, and the processing ends to prevent control information from being read out from the flash memory 103. The default value here is a constant held in the program. In S210, the apparatus itself may be caused to have an error state to end the processing, instead of the initialization of the values of the data sets.

In S202, if an assigned block without an invalid flag exists or if a read-out target block is determined, the CPU 101 moves the processing to S203. In S203, the CPU 101 reads out a data set within the read-out target block to a data set storage section in the control information decompression region 404 in the RAM 102.

In S204, the CPU 101 calculates a checksum of the data set read in S203 and checks whether the checksum is matched with the value of the checksum stored in the control information region 501 for the data set.

If it is determined in S205 that that the checksum is correct, the processing ends.

On the other hand, if it is determined in S205 that the checksum is not correct, the CPU 101 determines that the data in the current read block is invalid and moves the processing to S206. In S206, the CPU 101 sets the invalid flag for the current read block.

The CPU 101 in S207 determines whether the invalid flag is set for all assigned blocks. If so, the CPU 101 moves the processing to S208. In S208, the CPU 101 initializes the value of the data set in the control information decompression region 404 in the RAM 102 with a default value and ends the processing. The process in S208 may be the same as the processing in S210.

If it is determined in S207 that an assigned block without the invalid flag exists, the CPU 101 moves the processing to S209. In S209, a block having a highest counter value among blocks without the invalid flag is re-defined as a block to be read out and returns to S203 to continue the processing.

By performing the processing illustrated in FIG. 6, a valid and latest data set is decompressed to the RAM 102. Alternatively, if all data on the flash memory 103 are invalid, the data sets in the RAM 102 are initialized with a default value or the apparatus itself has an error state.

The data to be read out by the processing illustrated in FIG. 6 will be described with reference to FIGS. 8A to 8E.

For example, in writing a latest data set to a block, power may be shut down during the data deletion process and the data writing may not complete, as illustrated in FIG. 8B. In such a case, because the value in the counter region (upper part) 502 and the value in the counter region (lower part) 503 are not matched, "invalid" is determined in S304 in FIG. 7A. Other data of an assigned block having a valid and highest counter value are read out to the RAM 102.

As illustrated in FIG. 8C, if power is shut down upon completion of a data deletion process on a block, the counter region (upper part) 502 and the counter region (lower part) 503 have a matched value. However, the matched value is an invalid value of 0xFFFFFFFF. Therefore, "invalid" is determined in S306 in FIG. 7A, and other data of an assigned block having a valid and highest counter value are read out to the RAM 102.

Data having the state illustrated in FIG. 8D are stored in the flash memory 103 have the counter region (upper part) 502 and the counter region (lower part) 503 whose values are not matched, like FIG. 8B. Therefore, "invalid" is determined in S304 in FIG. 7A, and other data of an assigned block having a valid and highest counter value are read out to the RAM 102.

FIG. 8E illustrates a state after the completion of writing of a latest data set. Thus, the sequences in FIG. 6 and FIG. 7A read out the data as the latest data to the RAM 102.

Even if it is determined that the counter value is valid, the checksum in the control information region 501 is determined in S204 and S205 in FIG. 6. Thus, when data are not stored properly due to a failure occurring in an individual cell of the flash memory or electrical noise occurring during a writing process, "invalid" may be determined.

According to the embodiment above, a counter value as well as control variables and history data are written to an identical block. When a power shut-down state is shifted to a power supply state, the counter value indicative of the number of times of writing on a block may be used to determine a block storing the latest data in the flash memory 103.

This may eliminate the necessity for writing identification information indicating a block storing the latest data in the flash memory 103 in a different block from a block storing control information, for example. Thus, the time for the writing process may be reduced.

The ink jet printer 3 is configured to operate in synchronism with completion of writing important control information to a flash memory. For example, information describing cap open/closed state (hereinafter, called cap open/closed state information) of a printing head of the print engine unit 302 may be important information for keeping a print quality. Before printing starts, an "open state" is written to the cap open/closed state information on the RAM 102 and flash memory 103. After completion of the writing, the printing operation starts. Therefore, the processing according to this embodiment may increase the speed of writing to the flash memory 103 so that the time required for starting printing may be reduced.

The processing according to this embodiment may increase the speed of writing so that identification information, such as the count information, for identifying a block from which data is to be read out may be securely written. For example, according to a method which writes such identification information in a different block from a block storing real data in the flash memory 103, there may be an increased possibility that power is shut down while identification information is being written after completion of writing of read data. Then, it is determined that the processing for reading out data from the flash memory may determine that the identification information has not been appropriately written. Thus, the real data may not be read out even though the real data have been appropriately written.

On the other hand, because real data and the identification information corresponding to the real data are written in an identical block according to this embodiment, the possibility that power is shut down while identification information is being written after real data are written may be reduced, and the identification information may be written more securely. Thus, the latest data may be read out more securely from the flash memory.

Another advantage of this embodiment may be space saving of the flash memory 103. For example, when real data and the identification information are written in different blocks, at least two blocks may be required for the writing. On the other hand, according to this embodiment, real data such as control information and the identification information such as a counter value are both collectively written in one block. Thus, a reduced memory space may be required for writing those data and information.

According to this embodiment, fewer blocks are used for writing real data and identification information compared with a case where those data and information are written in different blocks. Therefore, the possibility that the number of times of writing exceeds an upper limit number of times of writing of the flash memory may be reduced.

It should be noted that the count information describes the number of times of update of a block in the flash memory 103. Therefore, the count information may be used for determining an excess beyond the upper limit number of times of writing of the flash memory 103. For example, the count information is applicable for control which changes an assigned block if the number of times of writing described in the count information in the current assigned block exceeds a predetermined number of times. Additionally, for example, the count value as described above may be referred to check how many times the flash memory 103 has been updated. For example, in a case where the CPU 101 acquires the number of times of writing on the flash memory 103 periodically or at predetermined times, if the number of times of writing exceeds a predetermined number, a display that prompts to replace the flash memory 103 may be presented through the operation UI unit 301.

As described above, the counter value according to this embodiment may be used as information on the number of updates performed on the flash memory 103. Thus, the count value is usable for writing control based on a durability of the flash memory 103 or as data regarding a usage condition of the ink jet printer 3. Details will be described below.

(5) Data Readout and Writing from and to Flash Memory Using Counter Value

A durable number of times of rewriting may sometimes be set for a flash memory. (It is assumed that one hundred thousand times are set for the flash memory 103 according to this embodiment). However, there may be a case where writing and reading operations may be performed normally on the flash memory 103 beyond the set durable number of times due to the individual difference among components of the flash memory 103.

Accordingly, a process will be described which allows data writing to the flash memory 103 significantly beyond the guaranteed durable number of times of rewriting and even beyond a highest value 0xFFFFFFFF that a counter region for the number of times of writing may hold.

In order for the CPU 101 to write a data set on the control information decompression region 404 of the RAM 102 to the flash memory 103, the processing illustrated in FIG. 5 is executed. Then, the processing illustrated in a flowchart in FIG. 9 is executed for the process for incrementing the counter value for a data set on a RAM in S102 in FIG. 5.

Figure 9:
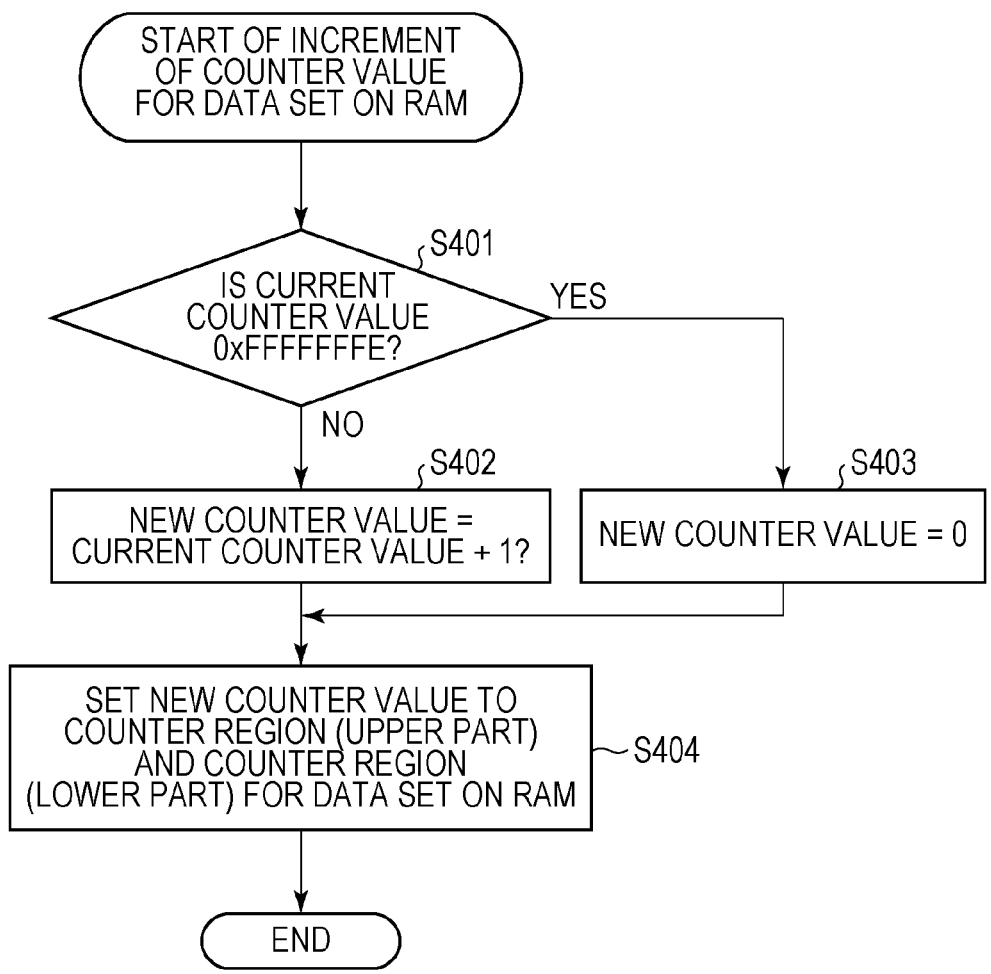
FIG. 9 is a flowchart illustrating an example of processing for incrementing the number of the number of times of writing.

FIG. 9 is a flowchart illustrating an example of the process for incrementing the number of times of writing. The processing illustrated in the flowchart in FIG. 9 is also implemented by the CPU 101.

If the current counter value is 0xFFFFFFFE in S401, the CPU 101 sets 0x0 as a new counter value in S403. On the other hand, if the current counter value is not 0xFFFFFFFE, the CPU 101 sets a value acquired by incrementing the current counter value as a new counter value in S402. In S404, the new counter value is set to the counter region (upper part) 502 and the counter region (lower part) 503 for the data set in the RAM 102. It should be noted that the counter regions are 4 bytes according to this embodiment, as described above. In other words, through the processing in S401 and S402, the counter value incremented up to an upper limit value 0xFFFFFFFE of the 4 byte space returns to the initial value 0.

The processing illustrated in FIG. 9 may result in mixture of a block having a counter value 0xFFFFFFFE and a block having a counter value 0x00000000 storing the latest data.

FIGS. 11A and 11B illustrate examples of counter values corresponding to blocks in a case where the counter values are set by the processing illustrated in FIG. 9. FIGS. 11A and 11B assume that three blocks are assigned to data sets of an identical type in the flash memory 103. In other words, three data sets for printing, for example, at a maximum are written to each of three blocks in rotation.

FIG. 11A illustrates counter values each corresponding to a block in a case where 0 (=0x00000000) is written as a new counter value to block 1 in S403 in FIG. 9. FIG. 11B illustrates a case where a counter value 1 (1x00000000) is set in S402 in the state in FIG. 11A and is written to a block 2. This may result in mixture of 0xFFFFFFFE that is the upper limit value of the counter value and counter values of the blocks 1 and 2. In this case, however, the blocks 1 or 2 having must be determined as a block storing the latest data to be read out. In order to do so, in a case where the processing illustrated in FIG. 9 sets a counter value, S201 in FIG. 6 determines a block to be read by using the processing in the flowcharts in FIGS. 10A and 10B, instead of the processing in the flowchart in FIG. 7A.

Figure 10A:
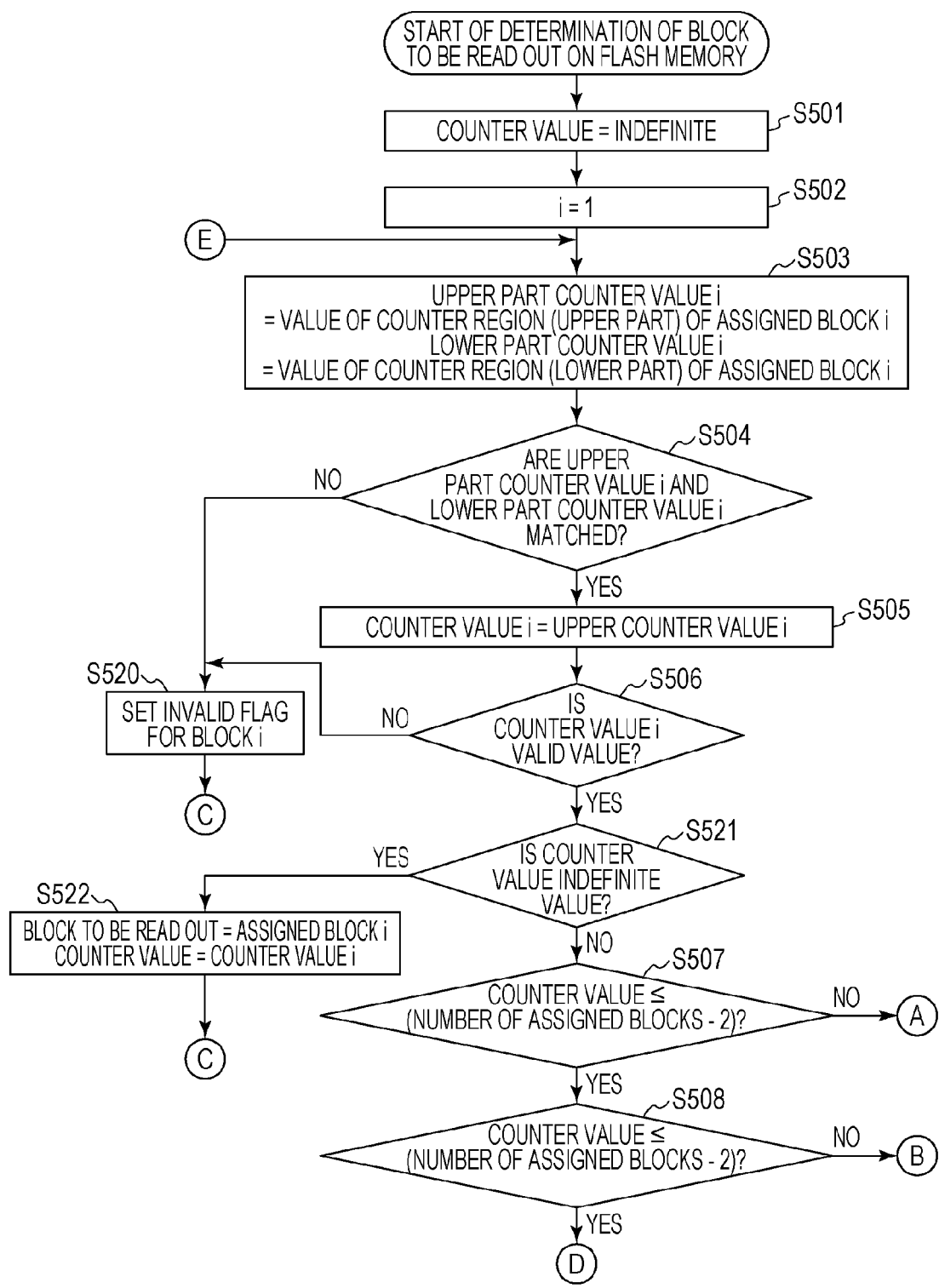

FIGS. 10A and 10B illustrate processing for determining a block to be read in a case where the processing illustrated in FIG. 9 sets a counter value. The flowcharts illustrated in FIGS. 10A and 10B are implemented by the CPU 101. The detail description on the same steps illustrated in FIG. 7A will be omitted. In an example in FIGS. 10A and 10B, the number of assigned blocks is equal to "3", as illustrated in FIGS. 11A and 11B.

In S501, a variable "counter value" of the counter value corresponding to a block to be read is set to "indefinite". For example, 0xFFFFFFFF may be set as the indefinite value.

Because the processing in S502 to S506 are similar to the processing in S302 to S306 in FIG. 7A, the detail description will be omitted. In the processing, whether writing to the block having the counter value i has properly completed or not is determined. If it is determined that the writing to the block has not properly completed, an invalid flag is set for the block i in S520, similarly to S309 in FIG. 7A.

In S521, whether the counter value of the read-out target block is an indefinite value or not is determined. If so, the CPU 101 in S522 sets the assigned block i as the read-out target block and sets the counter value i as the counter value.

Because the initialization processing in S501 and S502 above executes the processing in S522 if the variable is the initial value "1", the block 1 in FIGS. 11A and 11B is set as the read-out target block in S522.

In S511, the variable i is incremented. Whether the variable i is equal to or lower than 3 which is a total number of assigned blocked block is determined in S512. If the variable i is equal to or lower than the total number, the processing returns to S503.

If it is determined in S521 that the counter value of the block to be read is not an indefinite value, the CPU 101 in S507 determines whether the counter value of the current read-out target block and the counter value of the block to be read are equal to or lower than (the number of assigned blocks—2) or not. That is, whether the counter value of the read-out target block is 1 (=0x00000001) or 0 (=0x00000000) is determined.

The CPU 101 in S508 determines whether the counter value i and the counter value of the block to be read is equal to or lower than (the number of assigned blocks—2) or not. That is, whether the counter value of the block i (2 or 3) is 1 (=0x00000001) or 0 (=0x00000000) or not is determined.

If the determinations in S507 and S508 both result in "Yes", the counter values of the read-out target block and the block i are 0 or 1. Thus, the block having a higher counter value may be read out. Therefore, the CPU 101 compares the magnitudes of the counter values of the read-out target block and the block i in S509. If the counter value is equal to or higher than the counter value of the block to be read, the CPU 101 in S510 sets the assigned block i as a read-out target block and sets the counter value i as the counter value of the block.

If the determination in S507 results in "Yes" and if the determination in S508 results in "No", the counter value of the block 1 to be read out may be "0x00000000", and the counter value of the block i (=2) may be "0xFFFFFFFD", as illustrated in FIG. 11A. In this case, newer data are written to the block 1 though the block 2 has a higher counter value.

Accordingly, in S513, the CPU 101 determines whether the counter value i is lower than (0x100000000—the number of assigned blocks) or whether the counter value i is lower than 0xFFFFFFFD. If Yes in S513, the CPU 101 in S514 sets the block i having a higher counter value than that of the read-out target block as a read-out target block.

On the other hand, if No in S513, it means that the counter value i is 0xFFFFFFFD or 0xFFFFFFFE. Thus, the read-out target block (counter value 0 or 1) determined in S507 is given priority as a read-out target block. Thus, in this case, the read-out target block (counter value 0 or 1) is kept as a read-out target block without the processing in S514.

The processing in S515 is similar to the processing in S508. If Yes in S515, the counter value of the read-out target block may be 0xFFFFFFFD or 0xFFFFFFFE, and the counter value of the block i may be 0 or 1. Thus, the CPU 101 in S516 determines that the counter value i is lower than (0x100000000—the number of assigned blocks). If Yes in S516, the read-out target block having a larger counter value is kept as a read-out target block.

On the other hand, if No in S516, the counter value of the read-out target block is 0xFFFFFFFD or 0xFFFFFFFE, and the counter value of the block i is 0 or 1. Thus, in this case, because the block i (with a counter value of 0 or 1) stores newer data, the CPU 101 in S517 sets the block i as a read-out target block.

If No in S515, the counter value of the read-out target block and the counter value of the block i are both equal to or higher than 2. Therefore, the block having a higher count value is to be read out. Accordingly, the CPU 101 in S518 and S519 sets one having a higher counter value of the read-out target block and the block i to be read out by performing similar processing to that in S509 and S510.

If S511 and S512 result in determination that the number i of the block is in a range of 1 to 3, the processing is repeated.

By performing the processing in FIGS. 10A and 10B, a block having a counter value after initialized may be determined as a read-out target block even when the flash memory 103 stores both of a block having a counter value before initialized and a block having a counter value after initialized as illustrated in FIGS. 11A and 11B, for example. Thus, even in such a case, newer data may be read out from the flash memory 103.

Therefore, as illustrated in FIG. 9, in a case where the number of times of writing is higher than an upper limit value, counter values may be initialized to allow continued writing. In other words, when the flash memory 103 is rewritable beyond the upper limit value, for example, a user may keep using the ink jet printer 3 without replacing the flash memory 103 even the number of times of rewriting exceeds the upper limit value.

Having described that, according to the embodiment, only one data set is read out in the RAM 102, for example, a plurality of data sets such as two data sets may be read out. In this case, blocks may be read out in order from a block having a higher counter value, for example. Thus, data may be read out by prioritizing blocks storing newer data. Therefore, newer data may be read out to the RAM 102.

Having described that, according to the embodiment, the memory control apparatus is an electronic control circuit board installing an ink jet printer, for example, an embodiment of the present invention is not limited thereto. For example, the memory control apparatus may be a electrophotography printing apparatus which uses toner as a recording material for printing or may be a multi-function peripheral including a scanner for reading a document in addition to a printer. Without limiting to a printer, the memory control apparatus may be a PC (personal computer), a smart phone, a tablet, a cellular phone, a digital camera and other apparatuses.

The memory control apparatus according to this embodiment may write and read out data to and from an external nonvolatile memory connected to the apparatus, without limiting to writing and reading out to and from a nonvolatile memory internally included in the apparatus.

Further, having described a flash memory as a nonvolatile memory according to the embodiment above, the embodiment is not limited thereto. For example, the embodiment may be applicable to various memories such as an EEPROM.

The functions of this embodiment may also be implemented by the following configurations. That is, the functions of this embodiment may be achieved by supplying program code for executing the processes of the embodiment to a system or an apparatus and causing a computer (or CPU or MPU) of the system or apparatus to execute the program code. In this case, program code itself read out from a storage medium may implement the functions of the embodiment, which means that the storage medium storing the program code also implement the functions of this embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The program code for implementing the functions of this embodiment may be executed by one computer (CPU, MPU) or may be executed by cooperation of a plurality of computers. The program code may be executed by a computer, or hardware such as a circuit for implementing the functions of the program code may be provided. A part of the program code may be implemented by hardware, and the rest of the program code may be executed by a computer.

This application claims the benefit of Japanese Patent Application No. 2013-269660 filed Dec. 26, 2013, which is hereby incorporated by reference herein in its entirety.

What is claimed is:

1. A memory control apparatus, comprising:
a writing unit configured to write both of data to be written to one block of a plurality of blocks dividing a storage region of a nonvolatile memory and information for identifying a number of times of writing to the nonvolatile memory to the one block; and
a reading-out unit configured to read out data from a block based on the information written by the writing unit among the plurality of blocks
wherein the writing unit writes a predetermined value to all regions of the one block before writing the data and the information to the one block, and writes the predetermined data and the information to the one block storing the predetermined value.

2. The memory control apparatus according to claim 1, wherein the reading-out unit reads out a first block storing information corresponding to a first number of times of writing by priority as a read-out target over a second block storing information corresponding to a second number of times of writing that is lower than the first number of times of writing.

3. The memory control apparatus according to claim 1, wherein
the writing unit writes information corresponding to an initialized number of times if the number of times of writing to the nonvolatile memory is higher than a predetermined number of times; and
the reading-out unit determines a block storing information corresponding to information after the initialization as a read-out target block in a case where a plurality of data read-out candidate blocks include a block storing information corresponding to information before the initialization and information corresponding to information after the initialization.

4. The memory control apparatus according to claim 1, wherein
the reading-out unit reads out the information stored in the block; and
the writing unit writes both new data to be written and new information based on a number of times identified by the read out information to one block.

5. The memory control apparatus according to claim 1, wherein
the writing unit writes the information to the one block before and after writing data to the one block; and
the reading-out unit reads out data from the candidate block if the information written before the data are written and the information written after that in a read-out candidate block are matched.

6. The memory control apparatus according to claim 5, wherein the reading-out unit reads out data from a block in which the information written before predetermined data and the information written after the predetermined data by the writing unit are matched based on the information stored in another block in the nonvolatile memory if the information written before the predetermined data is not matched with the information written after that in the read-out candidate block.

7. The memory control apparatus according to claim 5, wherein the regions of the one block include a first region to which the information is written by the writing unit before writing of the data, a second region to which the data is written by the writing unit, and a third region to which the information is written by the writing unit after writing of the data.

8. The memory control apparatus according to claim 1, wherein the reading-out unit performs the reading out when the memory control apparatus is activated.

9. The memory control apparatus according to claim 1, wherein the nonvolatile memory is a flash memory.

10. The memory control apparatus according to claim 1, wherein the writing unit writes the data and the information to the nonvolatile memory included in the memory control apparatus.

11. The memory control apparatus according to claim 1, further comprising a printing unit configured to print an image on a print medium, wherein
the writing unit writes to the nonvolatile memory control information for controlling printing by the printing unit as the predetermined data.

12. The memory control apparatus according to claim 1, wherein the regions of the one block include a first region to which the information is written by the writing unit and a second region to which the data is written by the writing unit.

13. A memory control method, comprising:
writing both of data to be written to one block of a plurality of blocks dividing a storage region of a nonvolatile memory and information for identifying a number of times of writing to the nonvolatile memory to the one block; and reading out data from a block based on the information written by the writing unit among the plurality of blocks wherein the writing unit writes a predetermined value to all regions of the one block before writing the data and the information to the one block, and writes the predetermined data and the information to the one block storing the predetermined value.

14. The memory control method according to claim 13, wherein a first block storing information corresponding to a first number of times of writing is read out by priority as a read-out target over a second block storing information corresponding to a second number of times of writing that is lower than the first number of times of writing.

15. The memory control apparatus according to claim 13, wherein information corresponding to an initialized number of times is written if the number of times of writing to the nonvolatile memory is higher than a predetermined number of times; and a block storing information corresponding to information after the initialization is determined as a read-out target block in a case where a plurality of data read-out candidate blocks include a block storing information corresponding to information before the initialization and information corresponding to information after the initialization.

16. The memory control method according to claim 13, wherein both new data to be written and new information based on a number of times identified by the read out information are written to one block.

17. The memory control method according to claim 13, wherein the information is written to the one block before and after writing data to the one block; and data are read out from the candidate block if the information written before the data are written and the information written after that in a read-out candidate block are matched.

18. The memory control method according to claim 17, wherein data are read out from a block in which the information written before predetermined data and the information written after the predetermined data by the writing unit are matched based on the information stored in another block in the nonvolatile memory if the information written before the predetermined data is not matched with the information written after that in the read-out candidate block.

19. The memory control method according to claim 13, wherein the nonvolatile memory is a flash memory.

20. A storage medium storing a program causing a computer to execute the memory control method according to claim 13.

* * * * *